United States Patent [19]

Grula et al.

[11] Patent Number: 5,222,066
[45] Date of Patent: Jun. 22, 1993

[54] MODULAR SELF-TEST FOR EMBEDDED SRAMS

[75] Inventors: Jerome A. Grula; Gary W. Hoshizaki; Nicholas J. Spence, all of Mesa, Ariz.

[73] Assignee: Motorola, Inc., Schaumburg, Ill.

[21] Appl. No.: 633,862

[22] Filed: Dec. 26, 1990

[51] Int. Cl.$^5$ .................................... G01R 31/28
[52] U.S. Cl. .................... 371/21.1; 371/21.2; 371/21.3; 371/22.4
[58] Field of Search ............ 371/21.1, 21.2, 21.3, 371/22.4, 22.5

[56] References Cited

U.S. PATENT DOCUMENTS

| | | | |
|---|---|---|---|
| 3,795,859 | 3/1974 | Benante et al. | 371/21.4 |
| 4,541,090 | 9/1985 | Shiragasawa | 371/21.2 |
| 4,594,711 | 6/1986 | Thatte | 371/22.3 |
| 4,601,034 | 7/1986 | Sridhar | 371/22.4 |
| 4,635,261 | 1/1987 | Anderson et al. | 371/22.4 |
| 4,801,870 | 1/1989 | Eichelberger et al. | 371/22.4 |
| 4,872,168 | 10/1989 | Aadsen et al. | 371/22.3 |
| 4,903,266 | 2/1990 | Hack | 371/21.2 |
| 4,910,735 | 3/1990 | Yamashita | 371/22.4 |
| 5,033,048 | 7/1991 | Pierce et al. | 371/21.2 |

OTHER PUBLICATIONS

Rob Dekker et al, "Realistic Built-in Self-test for Static RAMs", IEEE Design and Test of Computers, Feb. 1989, pp. 26-34.

*Primary Examiner*—Charles E. Atkinson
*Attorney, Agent, or Firm*—Joe E. Barbee

[57] ABSTRACT

A self-test that is variable to test an SRAM that is embedded on a semiconductor die is achieved. The self-test is performed by a modular self-test circuitry that can be varied to permit generating addresses, and data patterns for various SRAM architectures and sizes. An address block develops addresses which define a test location or test word within the SRAM. The address block also develops a time delay which is used during a data retention test. A data block develops test patterns that are written into SRAM test locations. The data block also analyzes data read from SRAM test locations or test words. Both the address block and the data block are formed by combining a number of individual address or data cells, thereby providing addresses and data patterns for a variety of different SRAM configurations. A control block operates the address block, the data block, and the SRAM to perform two memory tests. A fault analysis test identifies faults within and between memory locations, and a data retention test identifies memory retention errors.

23 Claims, 2 Drawing Sheets

MODULAR SELF-TEST FOR EMBEDDED SRAMS

BACKGROUND OF THE INVENTION

The present invention relates, in general, to testing of semiconductor devices, and more particularly, to a modular self-test for embedded SRAMs which can be varied for a variety of SRAM architectures and sizes.

The acceptance of compiler developed integrated circuits, often referred to as application specific integrated circuits (ASICs) or standard cells, developed an increased need for improved test techniques for the large variety of circuits produced by those methods. Improved semiconductor manufacturing procedures provided increased complexity semiconductor devices, while compiler design techniques provided a means to rapidly develop designs of many different semiconductor devices. The resulting proliferation of complex ASIC semiconductor devices, increased the need for test methods that were flexible and that could be compiled concurrently with an ASIC design. One technique, generally referred to as self-test, placed circuitry on the ASIC device to accomplish testing of the ASIC device. Self-testing became increasingly important as ASIC devices included blocks of static random access memory (SRAM) that were embedded on the ASIC device. Previous self-test methods for embedded SRAMs were specifically designed for a particular type of memory cell and a particular memory configuration. Consequently, they were not variable and could not be compiled for testing various memory configurations. Since tests performed by those self-test circuits were generally limited to a particular memory cell configuration, they were not useful in determining failures of other types of cells. Addressing and data structures of those previous circuits were generally limited to a specific size of memory and a specific word width for the memory. Previous self-test methods often used serial access methods to provide addresses and data to an SRAM, and to read data back from the SRAM. Serial access limited the speed at which tests could access the SRAM and reduced the test's effectiveness in detecting noise induced coupling faults. Serial access self-test circuits were most effective for small memories (generally less than 2,000 total bits in the memory). Previous fault detection techniques were generally limited to known types of faults for the particular memory configuration used in the ASIC device, and were not sufficiently general to test a variety of memory sizes and memory cell structures. Most previous self-test circuits utilized one circuit and test method to determine memory faults and different ones to determine data retention errors. This approach increased the complexity of circuitry required to perform the tests. One result was that more time was required to generate memory addresses for a test than was required to read and test a location. Testing was slowed while the circuitry generated addresses, thereby reducing the test's effectiveness and increasing test time and costs.

Accordingly, it would be desirable to have a self-test circuit that is variable to test different SRAM memory sizes and memory cell implementations, that develops addresses and data in a parallel format which tests the memory's operating speed, that provides fault coverage which is suitable for a variety of memory sizes and configurations, that has a test sequence suitable for detecting faults in a variety of memory sizes and memory cell configurations, and that is independent of time required to develop addresses within the SRAM.

SUMMARY OF THE INVENTION

Briefly stated, the present invention is achieved by creating a modular self-test that is variable to test a variety of SRAM configurations that are embedded on a semiconductor die. The self-test is performed by a modular self-test circuitry that can be varied to permit generating addresses, and data patterns for various SRAM architectures and sizes. An address block develops addresses which define a test location or test word within the SRAM. The address block also develops a time delay which is used during a data retention test. A data block develops test patterns that are written into SRAM test locations. The data block also analyzes data read from SRAM test locations or test words. Both the address block and the data block are formed by combining a number of individual address cells and data cells, thereby providing addresses and data patterns for a variety of different SRAM configurations. A control block operates the address block, the data block, and the SRAM to perform the memory tests. A fault analysis test identifies faults within and between memory locations, and a data retention test identifies memory retention errors.

DETAILED DESCRIPTION OF THE DRAWINGS

Faults can occur within an SRAM from several sources which create different types of faults. Stuck-at-faults occur when a memory cell has a constant output value of logical one (1) or logical zero (0) independent of information written in the cell. Transition faults occur when a cell fails to accomplish a (0) to (1), or a (1) to (0) transition. Stuck-open faults occur when a cell has no connection to the SRAM's output. Depending upon an SRAM's internal configuration, a stuck-open fault can appear as a stuck-at-fault, or as a stuck-at-fault that aperiodically changes state. Coupling faults occur when a (0) to (1), or (1) to (0) transition in one cell or group of cells couples to another cell or cells. Two types of coupling faults can occur, state coupling and transition coupling. State coupling results from the state of one cell affecting the state of another cell. Transition coupling results from a cell being affected by a transition in another cell. Detection of transition coupling faults is enhanced by performing self-tests at the maximum speed of the SRAM. Since SRAM architectures usually include a group of individual storage cells or bits that are organized into groups or words, coupling faults can have various affects. Coupling faults can affect not only a given cell, but also a cell in one word can affect a cell in another word. Additionally, an apparent coupling fault can result from a failure in addressing logic of the SRAM which may cause writing to an incorrect cell yet reading from the correct cell, or vice versa. Data retention errors occur when a cell is unable to maintain a state over a period of time. It has been found that data retention errors represent a major source of SRAM failures. Therefore, effective SRAM fault detection must include a data retention test.

ASIC semiconductor devices generally are developed using computer aided design tools such as compilers which can develop ASIC semiconductor devices with a variety of logic and memory configurations. Generally, a designer identifies an SRAM for an ASIC device by specifying a number of bits in a word, also called word width, and the number of words in the SRAM, also called addresses or locations. For example, one particular ASIC device may require four thousand words each having a width of eight bits while another ASIC device may require twenty five thousand words each having a width of 10 bits, etc. Consequently, self-test circuits for ASIC devices should be formed as elements that can be combined in various configurations depending on an SRAM's architecture and size. Additionally, data or test patterns used during test sequences must also be variable for the different SRAM configurations. SRAM cells are generally designed as one of two different configurations, a four transistor cell (4T) or a six transistor cell (6T). These two cell structures typically have different types of characteristic faults, and even these characteristics can vary based upon a cell's internal layout or connections. SRAMs embedded in ASIC semiconductors may use cells that are designed with either of these structures, or even both types may be used for two different SRAMs on the same ASIC device. Consequently, effective self-test circuits and methods must be capable of detecting faults independent of the memory cell structure used for the SRAM.

While the invention is described with specific preferred embodiments, it is evident that many alternatives and variations will be apparent to those skilled in the semiconductor art. More specifically, the invention has been described for a particular SRAM architecture and size, as well as a particular circuit architecture although the method is directly applicable to other SRAM architectures and sizes, as well as to other self-test circuit architectures.

Figure 1:
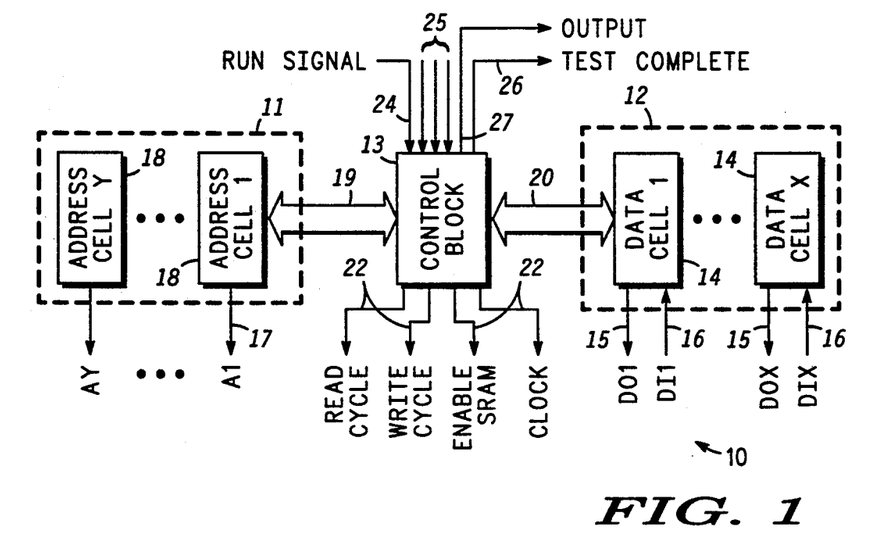
FIG. 1 is a block diagram of a self-test circuit in accordance with the present invention.

Referring to FIG. 1, the present invention includes an SRAM self-test circuit 10 that is modular so that elements can be configured for various SRAM sizes and architectures. Circuit 10 includes an address block 11, a data block 12, a control block 13, data signals 15 and 16, address signal 17, address control signals 19, data control signals 20, SRAM control signals 22, run control signal 24, output 27, and control block signals 25. During an SRAM self-test, data block 12 develops test patterns to be written into a test location or test word of the SRAM and also analyzes information read back from the test word. Data block 12 is modular and is formed by grouping together and interconnecting a number of data cells 14. Each data cell 14 has an element of a test pattern generator that develops a portion of the test patterns used to test the SRAM. In the preferred embodiment, one data cell 14 develops one bit of the test patterns. Data block 12 groups data cells 14 together and interconnects them to form a means for developing test patterns. Each data cell 14 also has two data signals coupling data cell 14 to the SRAM. A data output signal 15 is a means of providing data to the SRAM during a write cycle, and is used to couple the test patterns to the SRAM. A data input signal 16 provides a means for reading information out of the SRAM and into the data block in order to analyze the information. Data output 15 and data input 16 are coupled to one bit of an SRAM word. Since circuit 10 accesses the SRAM in a parallel format, words of more than one bit require several data cells each coupled to corresponding bits in the SRAM. That is, data cell one couples to SRAM bit one, etc. Consequently, data block 12 must have at least as many data cells 14 as there are bits in a word of the SRAM.

Data cell 14 also has a stage of a linear feedback shift register. In data block 12, these elements are interconnected into a multiple input linear feedback shift register that provides a means for analyzing data in order to detect errors in information read from the SRAM. Linear feedback shift registers are shift registers that have an output of the highest order shift register stage fed back to an input of one or more other shift register stages.

Figure 2:
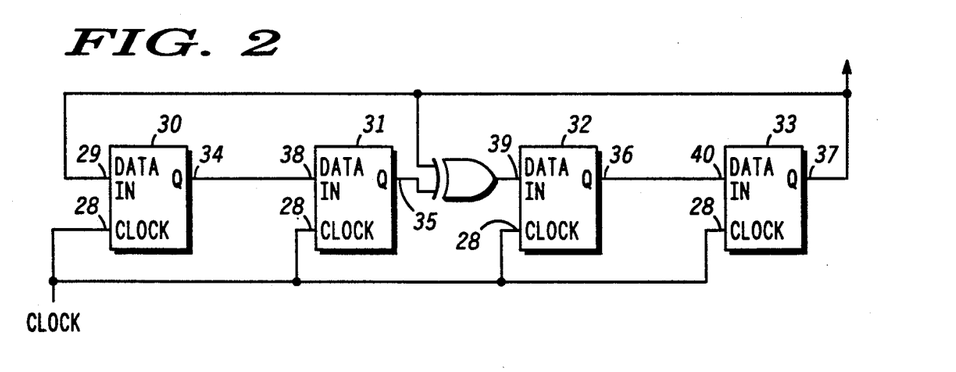
FIG. 2 is a block diagram of an example of a linear feedback shift register.

Referring to FIG. 2, an example of a linear feedback shift register includes four clocked flip-flops that form a first stage 30, a second stage 31, a third stage 32, and a fourth stage 33. Each stage has a clock input 28 that shifts the shift register one stage for each clock pulse applied to clock input 28. An input 29 of first stage 30 is provided by an output 37 of fourth stage 33. Second stage input 38 is provided by an output 34 of first stage 30. A feedback input 39 of third stage 32 is generated by exclusive "ORing" output 37 with an output 35 from second stage 31. An output 36 of third stage 32 becomes an input 40 to fourth stage 33. Information generated in the shift register can be read by monitoring output 37 during shifting of the shift register.

Figure 3:
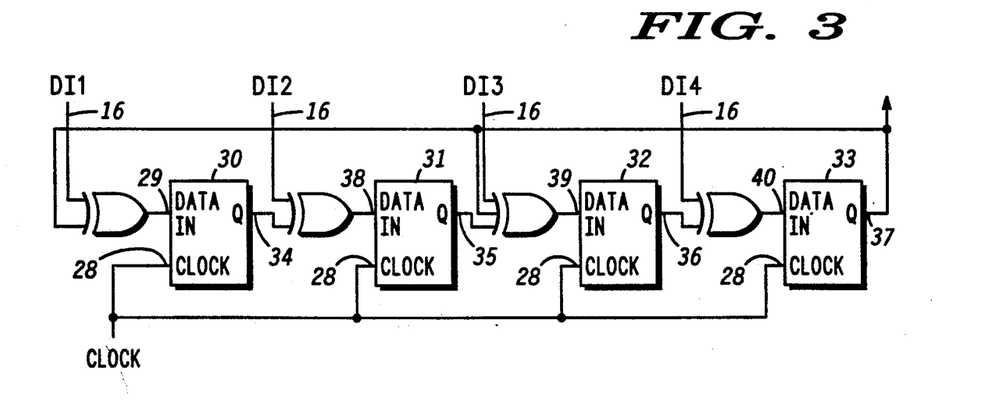
FIG. 3 is the shift register of FIG. 2 after adding inputs from an external data source.

FIG. 3 is an example of the shift register of FIG. 2 with an addition of four external data inputs 16 (DI1, DI2, DI3, and DI4) that are to be included in the multiple input shift register. Feedback input signal 39 of third stage 32 is now an exclusive "OR" of data from output 37, output 35, and data input three (DI3) from the SRAM. Remaining shift register inputs 29, 38, and 40 are now formed from corresponding data input signals (DI1, DI2, and DI4) that are logically exclusive "ORed" with shift register outputs 37, 34, and 36 respectively.

Referring back to FIG. 1, data block 12 interconnects the multiple input linear feedback shift register element or stage of each data cell 14 to form the multiple input linear feed back shift register that will be used to analyze information read from the SRAM. In the preferred embodiment, selection of stages that have a feedback input is determined by a feedback configuration that enables the parallel signature analysis register to develop a maximum length sequence. A maximum length sequence contains all possible combinations of codes or states that can be developed by a counter of a specific length except for one. Only one of the two codes all logic ones (1)s or all logic zeros (0)s will appear. The codes that are generated can be in any sequence, but each one must occur only once. Maximum length codes are well known in the industry. The shift register of data block 12 is shifted one stage during every read and every write cycle developed by circuit 10. During a write cycle, shifting the register cycles the contents of the register. As illustrated in FIG. 3, data read from the SRAM during a read cycle is logically exclusive "ORed" into the input of the stage corresponding to the SRAM bit to form a new shifted pattern. The procedure of accumulating data, shifting the data with feedback, and accumulating more data, etc. is referred to as parallel signature analysis and the shift register of data block 12 is referred to as a parallel signature analysis register.

At the conclusion of the SRAM self-test, a word that represents a signature of all the information stored in the SRAM will be contained in the shift register. This signature can be compared to a signature of a known good SRAM to determine if the SRAM under test had any failures or faults. The completed signature can be shifted out of the parallel signature analysis register and compared to the known good signature by other circuitry on the semiconductor die, or it can be shifted out of the semiconductor die for comparison by other circuitry. Accuracy of this parallel signature analysis method is determined by the length of the shift register, and is statistically determined by $1/(2^E-1)$ where E is the number of stages in the shift register. Accuracy of the signature can be improved by increasing the number of stages in the shift register. Data block 12 can have additional data cells, more than required by the SRAM memory width, to improve the accuracy of the parallel signature analysis.

Address cell 18 includes an address signal 17 that couples address cell 18 to the SRAM, and an element of an address counter. A number of address cells 18 are grouped together and interconnected to form address block 11. The counter elements are interconnected in address block 11 to form an address counter or means for addressing that develops addresses to identify the test word within the SRAM and also develops time delays for a data retention test which will be explained later. The address counter is incremented, decremented, or cleared as needed by the control block in order to develop the addresses. Address block 11 provides at least as many address signals 17 as the SRAM architecture requires. Since address block 11 produces a time delay by cycling the address counter through all possible addresses, additional address cells may be required to generate a time delay. That is, the length of time that is to be developed by address block 11 may require more address cells 18 than are required to address the SRAM. These extra address cells are only used during the generation of time delays. In the preferred embodiment, one address cell 18 has one bit of the address counter and one address signal. Also in this embodiment, at least nineteen address cells are interconnected to provide a time delay of approximately fifty msec. for the data retention test.

Control block 13 is used to control address block 11, data block 12 and the SRAM to perform testing of the SRAM. Control block 13 provides address control signals 19 that are used to control address block 11, data control signals 20 that are used to control data block 12, SRAM control signals 22 that are used during testing to control the SRAM, output 27, and test complete output 26. Control block 13 receives run control signal 24 and control block signals 25. SRAM control signals 22 are coupled to the SRAM and are used to enable the SRAM, signal a read cycle of the SRAM, signal a write cycle of the SRAM, and provide a clock or timing signal. During a read cycle, data control signals 20 enable data block 12 to accept data from data input signals 16 into the parallel signature analysis register and analyze the data. During a write cycle, data control signals 20 enable data signals 15 to provide a test pattern to be written into the SRAM. Data control signals 20 also include a serial output signal from the parallel signature analysis register that is supplied to control block 13. In the preferred embodiment, up to sixty-four data cells can be operated by data control signals 20. During a time delay operation, control block 13 does not enable the SRAM, therefore, no operations are performed on the SRAM although address signals 17 are active as the address counter cycles. Also, control block 13 performs a no operation (NO-OP) cycle. A NO-OP is formed by reading an SRAM address but not analyzing the information read from the SRAM. Control block 13 utilizes address control lines 19 to control the generation of addresses. Address control lines 19 also include an address counter status signal that is supplied to control block 13 from address block 11. In the preferred embodiment, control block 13 can control at least 19 address cells. Input control signals 24 and 25 are used by other circuitry (not shown) to operate control block 13. Run control signal 24 enables control block 13 to perform a self-test of the SRAM by operating circuit 10 to perform the fault analysis test and the data retention test. At the completion of the self-test, test complete output 26 is asserted to signify the test is complete. In the preferred embodiment, control block signals 25 and output 27 are signals that permit circuit 10 to be operated in accordance with industry standard testing methods as defined by the International Electrical and Electronic Engineers society (IEEE) joint test action group (JTAG) standard 1149.1. In this embodiment, output 27 is a serial output signal which can be utilized to shift the signature that is in the parallel signature analysis register out of circuit 10.

Figure 4:
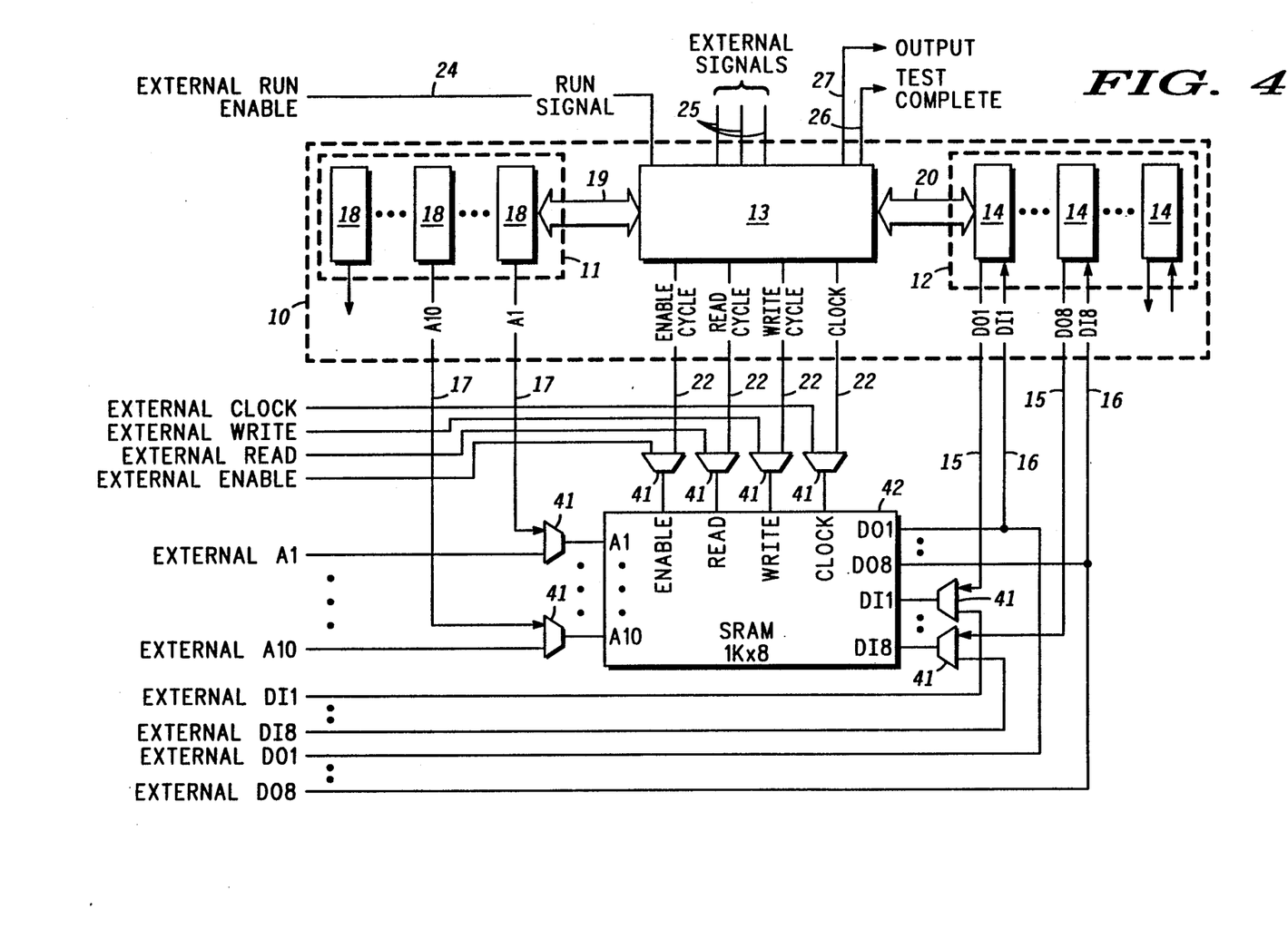
FIG. 4 is a block diagram illustrating an example of an SRAM connected to the circuit of FIG. 1.

FIG. 4 is an example of circuit 10 connected to an SRAM 42. In this particular example, SRAM 42 contains 1024 words or addresses each of which is eight bits wide. Multiplexers multiplex address, data, and control signals from circuit to the SRAM along with external address, data, and control signals. During testing, signals from circuit 10 are used to access the SRAM, while the external signals are used during normal operations. In this example, address block 11 of circuit 10 has more address cells 18 than is required to access the SRAM in order to develop an extended time delay. The additional address signals are not connected to the SRAM. Data block 12 also has additional data cells 14 to increase the accuracy of the parallel signature analysis register. The additional data signals are also not connected to the SRAM.

Circuit 10 uses a series of test patterns that are written to the SRAM and read back from the SRAM to identify faults in the SRAM. Since rapid access of the SRAM is important to locating coupling faults, the test patterns are written into the SRAM in a parallel format at the SRAM's normal operating speed which represents the SRAM's normal operating mode. Each potential SRAM fault can be detected by a certain series of read and write access cycles using certain test patterns. Data retention errors can be detected by a test sequence which includes writing the entire SRAM with logic zeros (0), delaying a period of time, reading the SRAM and verifying the pattern is in the SRAM, writing an inverted test pattern in the SRAM, delaying a period of time, and reading the SRAM and verifying the inverse pattern remains in the SRAM. A test sequence that can detect data retention errors can be represented in shorthand by:

$$\uparrow(W0)\ldots \text{delay} \ldots \uparrow(R0) \uparrow(W1) \ldots \text{delay} \ldots \uparrow(R1)$$

where:
delay represents a time delay

↑ for operations within the immediately following parentheses, performing the operations within the immediately following parentheses on each individual SRAM word in increasing order of addresses beginning at the first memory location of the SRAM.

↓ for operations within the immediately following parentheses, performing the operations within the immediately following parentheses on each individual SRAM word in decreasing order of addresses beginning at the last memory location of the SRAM.

( ) all operations within parentheses are performed in sequence on the same location before changing addresses.

Wx represents writing logic state x into a test word.

Rx represents reading a test word and expecting logic state x as information from the test word.

Although shown in ascending order, accesses to the SRAM during the test can be either ascending or descending. Also the test pattern, state x shown in the shorthand notation above, could be inverted.

Stuck-at faults can be detected by a test sequence that for each individual SRAM word writes a logic zero (0), reads the word to verify the (0), writes a logic one (1), then reads the word to verify the (1) and repeats the four cycles on each SRAM word. An inverse test pattern used with the same test sequence is also a valid test. The series of operations can be represented in shorthand by:

↑ (W0, R0, W1, R1)   or   ↑ (W1, R1, W0, R0)   or

↓ (W1, R1, W0, R0)   or   ↓ (W0, R0, W1, R1)

Transition faults can be detected with a similar test sequence and pattern. It is important to ensure a transition from both a (0) to a (1), and a (1) to a (0) is accomplished by each and every individual cell in the SRAM. A transition fault test sequence that ensures both transitions are successfully accomplished for all cells in the SRAM uses a test sequence that writes a (0), reads for verification, writes a (1), reads for verification, writes a (0), and reads for verification. An inverse pattern used with the same test sequence also accomplishes the same fault detection. A shorthand representation of the test sequence for SRAM words instead of cells is:

↑ (W0, R0, W1, R1, W0, R0)   or

↑ (W1, R1, W0, R0, W1, R1)   or

↓ (W1, R1, W0, R0, W1, R1)   or

↓ (W0, R0, W1, R1, W0, R0)

This test sequence is similar to the stuck-at test sequence, with the transition fault test sequence having another write and read cycle with an inverse test pattern.

Since stuck-open faults may result from SRAM architecture as well as a memory cell fault, a stuck-open fault can be detected by a test sequence which includes holding the address constant while reading a word to verify a previous write operation, writing into the cell an inverse of what was previously written into the cell, then reading the cell to verify the inverse. One method to accomplish this for an SRAM is a test sequence that writes a test pattern into the entire memory, then for each word; reads the word for verification, writes the inverse of the original test pattern into the word, reads the word for verification, changes addresses, and repeats the read-write-read test sequence for each remaining word of the SRAM. A shorthand representation is:

↑ (W1)   ↑ (R1, W0, R0)   or

↓ (W1)   ↓ (R1, W0, R0)   or

↑ (W0)   ↑ (R0, W1, R1)   or

↓ (W0)   ↓ (R0, W1, R1)

As shown in the shorthand notation above, accesses to the SRAM can be in either ascending or descending order.

As previously stated, state coupling faults are a subset of transition coupling faults and both can be detected with a test that detects transition coupling faults. Transition coupling faults can occur between any cells within a memory and for any change of state of a cell. For example, transition coupling faults can effect two cells, A and B, in any or all of the manners shown below:

| cell | transition | coupled cell | state change |
|------|------------|--------------|--------------|
| A | 0 > 1 | B | 0 > 1 |
| A | 0 > 1 | B | 1 > 0 |
| A | 1 > 0 | B | 0 > 1 |
| A | 1 > 0 | B | 1 > 0 |
| B | 0 > 1 | A | 0 > 1 |
| B | 0 > 1 | A | 1 > 0 |
| B | 1 > 0 | A | 0 > 1 |
| B | 1 > 0 | A | 1 > 0 |

A test sequence to detect coupling faults must consider all the possible combinations of cells in an SRAM and the patterns that will detect one cell affecting the same or different state of other cells in the SRAM. A series of read-write access cycles using different test patterns is required to detect all coupling faults in all cells. A test sequence that detects these faults for SRAM cells has a first section that accesses each cell in the SRAM in ascending order of addresses starting at the SRAM's first cell, called ascending order, and a second section accesses each cell in the SRAM in descending order of addresses starting at the SRAM's last cell, called descending order. The test sequence includes: writing, in ascending order, a logic zero (0) to all cells; followed by, in ascending order for all cells, reading the cell to verify the (0) and writing the cell with a (1); followed by, in ascending order for all cells, reading the cell to verify the (1) and writing a (0); followed by, in descending order for all cells, reading the cell to verify the logic zero and writing a logic one (1), followed by, in ascending order for all cells, reading the cell to verify the (1) then writing a (0), followed by in, descending order for all cells, reading the cell to verify the (0). A shorthand notation for the coupling fault test sequence is:

↑(W0) ↑(R0,W1) ↑(R1,W0) ↓(R0,W1) ↓(R1,W0)-
↓(R0)

where:
The above operations are performed on individual SRAM cells instead of SRAM words.

Expanding this test sequence from cells or bits to words having a number of bits where the number of bits can vary from one SRAM configuration to another, requires the use of a series of test patterns that create the same test conditions as the test of the cells shown above. The test patterns, explained later, will form alternate transitions of adjacent bit locations to duplicate the conditions above. The number of test patterns required will vary with the number of bits in the SRAM word.

It has been found that one test sequence that uses a number of test patterns can incorporate all of the fault test sequences and test patterns that have been shown. The test sequence is also independent of the type of cell used to implement the SRAM. The test sequence is a series of seven sub-tests that all have three access cycles. All three access cycles are performed on a word before the address is updated to the next word. Each sub-test is performed on every SRAM word before a subsequent sub-test is performed. The sub-tests have a general sequence of; read information from a test word and analyze information read from the test word by using the parallel signature analysis register, write a test pattern into the test word, read the test word and analyze the new information. The test sequence of seven sub-tests is performed with a series of test patterns (explained later) with the number of test patterns determined by the SRAM word width. A shorthand representation of the test sequence and its sub-tests is:

↑(·,WP,RA) ↑(·,WI,RA) ↑(RA,WP,RA) ↑(RA,-
WI,RA) ↓(RA,WP,RA) ↓(RA
,WI,RA) ↓(RA,WP,RA)

where:
( ) Operations within the parentheses are a sub-test with all operations performed in sequence on all words of the SRAM. Address changes occur after all three access cycles of the sub-test are complete.
· is a NO-OP operation created by the control block disabling the parallel signature analysis register while performing a read cycle.
WP represents writing a test pattern to the test word.
WI represents writing an inverse of the test pattern to the test word.
RA represents reading the test word and analyzing the information in the parallel signature analysis register.

There are a few noticeable differences between the test sequence above and the coupling fault test sequence shown earlier. First, the addition of extra sub-tests. The first cycle of the coupling fault test does not ensure all cells made a transition. That is, some cells could already have been in the state that is written during the first write cycle of the coupling fault test. Consequently, the test sequence has a write cycle at the beginning to ensure all cells are initialized to a known state, and undergo a transition between the first and second sub-tests. Second, the fault analysis test's seven sub-tests end with a read cycle, unlike the coupling fault test. This ensures every cell of the SRAM has a read of alternate logic levels without address changes in order to detect stuck-open faults. Third, in order to simplify circuit 10 of FIG. 1, all sub-tests have the same three access cycle sub-test sequence. Therefore, each sub-test must have a read-write-read structure with the only option being a NO-OP or a time delay. Consequently, the first and second include a NO-OP at the beginning.

The test sequence remains constant for any SRAM architecture or size. To ensure all coupling faults are detected, the test sequence is repeated with a series of test patterns that forms alternate transitions of adjacent bit locations. Consequently, the test patterns used for each write cycle are dependent on the SRAM's word width.

In the preferred embodiment, the test sequence is a repeating series of a number of logic zeros (0)s followed by the same number of logic ones (1)s. The (0) (1) is repeated to provide one test pattern bit for each bit of the SRAM word. The number of (0)s and (1)s is one for the first test pattern. Each successive test pattern used during a repeat of the test sequence, doubles the number until the test sequence is performed with a final test pattern of all logic zeros (0)s. For example, a first test pattern includes a series of bits having an alternating pattern of (0), (1), (0), (1), (0) . . . with one bit of the pattern for each SRAM bit. The next pattern doubles the number of adjacent (0)s and (1)s forming an alternating pattern of (0), (0), (1), (1), (0) . . . , the next pattern once again doubles the number of adjacent (0)s and (1)s forming an alternating pattern of (0), (0), (0), (0), (1) . . . , etc. The doubling of (0)s and (1)s continues until the test sequence is performed using a final test pattern of all (0)s. This test sequence is capable of detecting all faults, but is not used for data retention errors.

A final enhancement must also be included to ensure all SRAM logic used to decode addresses is functioning properly. Address decoding logic in the SRAM typically subdivides an address into three sections. One section uses a portion of the address signals to define memory blocks within the SRAM, a second section uses another portion of the address signals to define rows of memory cells within a block, and a third section uses still another portion of the address signals to define columns of memory cells within the block. A proper fault test will include addressing methods to exercise each of these sections for detecting faults that may result from failures in the addressing logic. Testing a memory by performing the test sequence once for each of the test patterns while testing the three addressing methods, defines a fault analysis test.

In the preferred embodiment, the test sequence is performed using a block fast addressing method with a first test pattern, a row fast addressing method for a second test pattern, and a column fast addressing method for a third test pattern. The block fast, row fast, and column fast methods refer to using the portion of the address signals associated with each section as the low order address signals, thereby changing those signals more often or faster than other signals. The three methods are repeated for subsequent test patterns. Therefore, the test sequence is performed at least three times for any size memory.

A data retention test can be performed by using the same test sequence with the final test pattern, but replacing some of the sub-tests with a time delay. The delay is created by cycling of the address counter in the address block of circuit 10. A shorthand notation for the data retention test sequence is:

↑(·,W0,RA) ↑(·,·,·) ↑(·,·,·) ↑(RA,W1,-RA) ↓(·,·,·) ↓(·,·,·) ↓(RA,W0,RA)

where:
W0 represents writing an all (0) test pattern to the test word.

Using both the fault analysis test and the data retention test provides the capability to detect all fault conditions and data retention faults that could occur in an SRAM. Circuit 10 of FIG. 1 performs both the fault analysis test and the data retention test. The number of address cells and data cells of circuit 10 is variable to provide test patterns and addresses for a variety of SRAM architectures and sizes. Updates of the address counter are performed during the three cycle access sequence of a sub-test thereby maintaining maximum access speed to the SRAM during the test.

By now it should be appreciated that there has been provided a novel way to provide a self-test for SRAMs embedded on a semiconductor die with a self-test circuit and other circuitry. The self-test is variable to be used with a variety of SRAM architectures and sizes. The tests are independent of the SRAM cell implementation thereby expanding the potential usage to all SRAMs. Address generation is independent of the time required to perform an address calculation. The self-test is performed with a parallel format which operates the SRAM at the maximum speed allowable thereby improving fault detection capability of the self-test, and reducing test time and related test cost. Fault detection capability is modular and can be varied based on the SRAM requirements. The self-test can be used with a variety of SRAM implementations and can be used to provide self-test capability to any type of SRAM. Using the same test sequences to perform the fault analysis test and the data retention tests reduces the implementation cost.

We claim:

1. A modular self-test circuit for testing an embedded SRAM that is on a semiconductor die together with the circuit which comprises:
an address cell having an element of an address counter and also having an address signal that couples the address cell to the SRAM;
an address block having a plurality of interconnected address cells which form an address counter wherein the address block develops an address to identify test locations within the SRAM and also develops a predetermined time delay, the plurality of address cells in the address block being at least sufficient to provide addresses for all SRAM locations to be tested;
a data cell having an element of a test pattern generator that develops a portion of test patterns which are used for testing the SRAM;
at least one data signal provided by the data cell wherein the data signal is coupled to the SRAM;
a stage of a parallel signature analysis register which is formed as a portion of the data cell;
a data block formed by a plurality of interconnected data cells wherein the data block has a test pattern generator that develops a series of test patterns to be written into the SRAM, has a parallel signature analysis register that analyzes information read from the SRAM, and also has data signals coupled to the SRAM, the plurality of data cells in the data block being sufficient to provide at least one data cell for each bit in the test location;
a control block having a plurality of control signals coupled to the address block, the data block, and the SRAM wherein the control block controls testing of the SRAM by operating the address block, the data block, and the SRAM to perform a fault analysis test using the test patterns developed by the data block and to perform a data retention test; and
a run signal coupled to the control block wherein asserting the run signal enables the control block to perform the fault analysis test and the data retention test.

2. The circuit of claim 1 wherein the at least one data signal provided by the data cell includes a data output signal which couples a bit of the test pattern to a bit of the test location, and a data input signal which couples a bit of data read from the test location to the parallel signature analysis register.

3. The circuit of claim 1 further including the control block having input signals for operating the control block, and a test complete output signal which indicates testing of the SRAM is complete.

4. The circuit of claim 1 wherein the control block having a plurality of control signals includes control signals for at least 64 data cells and at least 19 address cells.

5. The circuit of claim 1 wherein the fault analysis test performed by the control block includes a series of seven sub-tests with each sub-test having three consecutive access cycles to every test location of the SRAM before beginning the next sub-test wherein the three access cycles include reading the test location and analyzing information read from the test location, writing the test location with the test pattern developed by the data block, then reading the test location and analyzing the information read from the test location.

6. The circuit of claim 5 wherein the seven sub-tests have a first, a second, a third, and a fourth sub-test that access memory locations in ascending order beginning with a first location of the SRAM; have a fifth, a sixth and a seventh sub-test that access memory locations in descending order beginning with a last location of the SRAM; and have a NO-OP cycle that is a first access cycle of the first and the second sub-tests.

7. The circuit of claim 1 wherein the series of test patterns developed by the data block includes a first test pattern having a series that repeats one logic zero (0) followed by one logic one (1), and each sequential test pattern having a repeating series that doubles the number of logic zeros (0)s followed by double the number of logic ones (1)s of an immediately preceding test pattern until a final test pattern of all zeros is attained.

8. The circuit of claim 1 wherein the data retention test performed by the circuit includes performing a portion of the fault analysis test with a test pattern having all logic zeros (0) and also includes the control block disabling the SRAM to form a time delay during a portion of the data retention test.

9. The circuit of claim 1 wherein the control signals coupled to the address block include the control signals coupled to the address counter in order to increment, decrement, and clear the address counter.

10. The circuit of claim 1 wherein the plurality of address cells in the address block is sufficient to develop the predetermined time delay.

11. A method of testing an SRAM which is embedded on a semiconductor die with a circuit that performs the testing which comprises:
developing a plurality of test patterns with each test pattern forming a series that repeats a quantity of logic zeros followed by an equal quantity of logic ones wherein the quantity is one for a first test pattern, the test pattern having a sum of logic zeros plus the logic ones at least equal to a number of bits in a word of the SRAM;
developing a plurality of addresses with each address identifying a test word, the plurality of addresses at least equal to a number of words in the SRAM;
performing a test sequence having a plurality of sub-tests with a sub-test including three consecutive access cycles to each word of the SRAM wherein one of the three access cycles includes writing the first test pattern to the test word;
repeating the test sequence a number of times with each repeat of the test sequence using a successive test pattern to replace the first test pattern wherein the successive test pattern is formed by doubling the quantity of logic zeros and logic ones of an immediately preceding test pattern until a final repeat of the test sequence is performed using a final test pattern having all logic zeros; and
performing a data retention test that includes repeating the test sequence using the final test pattern but selectively substituting a time delay for some of the sub-tests.

12. The method of claim 11 wherein the performing a test sequence includes performing a first sub-test by accessing the SRAM in ascending order beginning with a first SRAM word and performing a NO-OP cycle followed by writing the first test pattern into the word followed by reading information from the word and analyzing the information, performing a second sub-test by repeating the first sub-test using an inverse of the first test pattern, performing a third sub-test by repeating the first sub-test but replacing the NO-OP cycle with reading information from the word and analyzing the information, performing a fourth sub-test by repeating the third sub-test using the inverse of the first test pattern, performing a fifth sub-test by accessing the SRAM in descending order beginning with a last word of the SRAM and reading information from the word and analyzing the information followed by writing the first test pattern into the word followed by reading information from the word and analyzing the information, performing a sixth sub-test by repeating the fifth sub-test using the inverse of the first test pattern, and performing a seventh sub-test by repeating the fifth sub-test.

13. The method of claim 12 wherein accessing the SRAM includes using a block fast addressing method to access the SRAM with the first test pattern, a row fast addressing method with a second test pattern, and a column fast addressing method with a third test pattern then repeating the three addressing methods in the same sequence for successive test patterns.

14. The method of claim 12 wherein the reading information from the word and analyzing the information includes analyzing the information using a parallel signature analysis register having a plurality of stages, the plurality of stages at least equal to the number of bits in a word of the SRAM.

15. The method of claim 11 wherein the performing a data retention test step includes substituting the time delay once and a sixth sub-test without changing the three consecutive access cycles of a first sub-test, a fourth sub-test and a seventh sub-test of the test sequence.

16. The method of claim 11 further including initiating testing of the SRAM in response to a run signal of the circuit.

17. The method of claim 11 further including generating a signal that indicates testing of the SRAM is complete.

18. The method of claim 11 wherein the performing a test sequence step includes accessing a word by generating an address using an address counter that is a portion of the circuit, and updating information in the address counter during the three consecutive access cycles of a sub-test.

19. The method of claim 11 wherein the developing a plurality of test patterns step includes developing the test patterns by using a test pattern generator that is a portion of the circuit.

20. A self-test circuit for testing an embedded SRAM which comprises:
means for addressing having a plurality of cells to access a variety of SRAM address architectures wherein the means for addressing develops addresses to identify a test word, and develops a time delay;
means for generating test patterns that is variable to provide a number of test patterns and inverted test patterns for testing a variety of SRAM word sizes;
means for analyzing having a plurality of stages for detecting errors in information read from a variety of SRAM word sizes, and for varying error detection accuracy; and
means for generating test patterns, the means for detecting errors, and the SRAM in order to perform a fault analysis test and a data retention test on the SRAM, the fault analysis test being able to detect stuck-at faults, transition faults, stuck-open faults, transition coupling faults, and state coupling faults in the SRAM by performing a first test sequence once for each test pattern wherein the first test sequence has seven sub-tests and each sub-test includes three consecutive access cycles to the test word, the data retention test detects data retention errors in the SRAM by performing a second test sequence with a test pattern having all logic zeros wherein the second test sequence is formed by replacing portions of the first test sequence with a time delay.

21. The self-test circuit of claim 20 further including the means for addressing developing addresses for the fault analysis test with a block fast address mode while using a first test pattern, a row fast address mode while using a second test pattern, a column fast address mode while using a third test pattern, and repeating the block fast, row fast, and column fast addressing sequence for subsequent test patterns.

22. The self-test circuit of claim 20 wherein the test patterns include a repeating series of a number of logic zeros followed by an equal number of logic ones wherein the number is one for a first test pattern and the number doubles for each successive test pattern until a final test pattern having all zeros (0)s is provided.

23. A self-test method for embedded memories which comprises:
- providing a self-test circuit for testing a variety of different memory architectures and sizes wherein the self-test circuit includes a means for developing addresses, means for generating test patterns, and means for analyzing data;
- performing a fault analysis test on the memory wherein the fault analysis test is performed by the self-test circuit; and
- performing a data retention test on the memory wherein the self-test circuit performs the data retention test by developing a test pattern; accessing all memory locations and at each location writing the test pattern into the memory location, reading and analyzing the information read from the memory location, and performing a time delay; accessing all memory locations and at each location reading and analyzing the information read from the location, writing an inverse of the test pattern into the memory location, and reading and analyzing the information read from the location; performing a time delay; accessing all memory locations and at each location reading and analyzing the information read from the location, writing the test pattern into the memory location, and reading and analyzing the information read from the location.

* * * * *